United States Patent [19]

Vermeersch et al.

[11] Patent Number: 5,270,354
[45] Date of Patent: Dec. 14, 1993

[54] METHOD OF MAKING AQUEOUS LOADED LATEX COMPOSITIONS

[75] Inventors: Joan T. Vermeersch, Deinze; Rafaël P. Samijn, Wilrijk; Daniël M. Timmerman, Mortsel; Paul J. Coppens, Turnhout, all of Belgium

[73] Assignee: AGFA-Gevaert, N.V., Mortsel, Belgium

[21] Appl. No.: 783,350

[22] Filed: Oct. 28, 1991

[30] Foreign Application Priority Data

Nov. 2, 1990 [EP] European Pat. Off. ........ 90202901.6

[51] Int. Cl.$^5$ .......................... C08J 3/02; C08K 3/20; C08L 23/00
[52] U.S. Cl. .................................... 523/334; 523/333; 524/1; 524/501
[58] Field of Search ................ 523/334, 333; 524/501, 524/1

[56] References Cited

U.S. PATENT DOCUMENTS 4,108,811  8/1988  Eckhoff .............................. 524/507
4,948,829  8/1990  Mitsuji et al. ....................... 524/591

*Primary Examiner*—Paul R. Michl
*Assistant Examiner*—Patrick Niland
*Attorney, Agent, or Firm*—Breiner & Breiner

[57] ABSTRACT

Method of making aqueous dispersions of hydrophobic polymer particles loaded with at least one hydrophobic compound, comprising the consecutive steps of dissolving said at least one hydrophobic compound in a water-immiscible organic solvent medium, dispersing the solution obtained in water or in an aqueous medium to form a dispersed phase having an average droplet size lower than 5 μm, mixing the resulting dispersion with a dispersion of hydrophobic polymer particles in water or in an aqueous medium, said hydrophobic polymer particles being swellable in said water-immiscible solvent medium and having an average particle diameter ranging from 0.02 to 5.0 μm, stirring the mixture obtained to allow said hydrophobic compound to associate with said hydrophobic polymer particles, and removing said water-immiscible organic solvent medium by evaporation.

7 Claims, No Drawings

METHOD OF MAKING AQUEOUS LOADED LATEX COMPOSITIONS

BACKGROUND OF THE INVENTION

1. Field of the Invention

The present invention relates to a method of making aqueous dispersions of polymer particles loaded with at least one hydrophobic compound.

By the term "loaded" is meant that said at least one hydrophobic substance is adsorbed on or absorbed by the polymer particles that constitute the dispersed phase.

2. Description of the Prior art

Methods for associating hydrophobic ingredients with polymer particles have been described in i.a. U.S. Pat. Nos. 4,203,716, 4,214,047, 4,247,627, 4,304,769, and GB-A 1,504,949.

Known loaded polymer particles are prepared by adding an aqueous dispersion of polymer particles with stirring to a solution of the hydrophobic compound in a water-miscible solvent or mixture of such solvents. The stability of loaded polymer particles is of great importance, of course. The loaded hydrophobic compound must not desorb or dissociate indeed from the polymer particles. Unfortunately, prior art loaded polymer particles often have a poor stability and may comprise fractions of crystallized hydrophobic compound. Also the loaded polymer particles often tend to form conglomerations.

SUMMARY OF THE INVENTION

It is therefore an object of the present invention to provide an improved method of making aqueous dispersions of highly stable hydrophobic polymer particles loaded with at least one hydrophobic compound, said loaded polymer particles being free of conglomerations and comprising substantially no crystallized hydrophobic compound.

This and other objects of the present invention are achieved by providing an improved method of making aqueous dispersions of hydrophobic polymer particles loaded with at least one hydrophobic compound, comprising the consecutive steps of:

dissolving said at least one hydrophobic compound in a water-immiscible organic solvent medium e.g. ethyl acetate, dispersing the solution obtained of said at least one hydrophobic compound in water or in an aqueous medium to form a dispersed phase having an average droplet size lower than 5 $\mu$m, mixing the resulting dispersion of said at least one hydrophobic compound with a dispersion of hydrophobic polymer particles in water or in an aqueous medium, said hydrophobic polymer particles being swellable in said water-immiscible solvent medium and having an average particle diameter ranging from 0.02 to 5.0 $\mu$m, preferably from 0.2 to 4.6 $\mu$m, stirring the mixture obtained to allow said hydrophobic compound to associate with said hydrophobic polymer particles, and removing said water-immiscible organic solvent medium by evaporation.

DETAILED DESCRIPTION OF THE INVENTION

By "hydrophobic compound" as used herein is meant any compound that is substantially insoluble in distilled water at 25° C., meaning that only a maximum of about 0.5% by weight of said hydrophobic compound can dissolve in water.

The hydrophobic compound is first dissolved in a said water-immiscible organic solvent and secondly the resulting solution of said hydrophobic compound is dispersed in water or in an aqueous medium, before addition to the dispersion of hydrophobic polymer particles in water or aqueous medium.

The dispersing step is usually performed with the aid of dispersing agents. Suitable dispersing agents are well known and include e.g. the sodium salt of n-dodecylbenzene sulphonic acid, the sodium salt of oleylmethyltauride, sodium stearate, 2-heptadecyl-benzimidazole-5-sulphonic acid sodium salt, sodium sulphates of aliphatic alcohols containing more than 5 carbon atoms per molecule such as 2-methylhexanol sodium sulphate, the sodium salt of di-isooctyl ester of sulphonated succinic acid, sodium dodecyl sulphate, and condensation products of ethylene oxide and alkyl phenols.

It has been established that if a solution of a hydrophobic compound is added as such directly to the dispersion of hydrophobic polymer particles in water or aqueous medium, these particles tend to conglomerate thus forming clusters that reduce the homodispersity. If, however, in accordance with the present invention, the solution of hydrophobic compound is dispersed in water or aqueous medium and the resulting dispersion is mixed and stirred with the dispersion of hydrophobic polymer particles, homodisperse loaded polymer particles are obtained.

For carrying out the method of the present invention any hydrophobic compound that complies with the above defined solubility criteria is suited. Hydrophobic compounds that can be loaded advantageously according to the method of the present invention can be chosen from such photographically active hydrophobic compounds like i.a. hydrophobic antihalation dyes, hydrophobic filter dyes, hydrophobic optical brighteners, hydrophobic UV-absorbing agents, hydrophobic spectral sensitizers or desensitizers. hydrophobic bleachable dyes, hydrophobic antioxidants, hydrophobic colour couplers, hydrophobic antifogging agents, hydrophobic dye-releasing compounds, hydrophobic colour developing agents, hydrophobic developing agents, hydrophobic silver halide solvents, hydrophobic polymerizable compounds, and hydrophobic photoinitiators.

As a consequence, a wide range of loaded polymer particles can be made for photographic use by the method of the present invention. These loaded polymer particles may indeed find widely divergent applications in the photographic field e.g. in the manufacture of black-and-white or colour diffusion transfer reversal materials, X-ray materials, colour photographic materials, and photographic materials for dry development.

The method of the present invention can be used advantageously for loading hydrophobic polymer particles with a hydrophobic dye, said dye-loaded polymer particles being employed for forming an antihalation layer or filter layer in a photographic layer assemblage. According to a preferred embodiment of the invention the dye-loaded polymer particles are used in a photosensitive monosheet layer assemblage for making a lithographic aluminium printing plate according to the diffusion transfer reversal process, as described in the EP Patent Application 90202900.8, and in the corresponding U.S. Ser. No. 07/783,244 filed on even date with the present application and entitled "Method of making lithographic aluminium offset printing plates", said assemblage comprising in the given sequence a hydrophilic grained and anodized aluminium foil, an intermediate layer, and a silver halide emulsion layer, said intermediate layer comprising dye-loaded polymer particles prepared according to the method of the present invention.

Although the method of the present invention is particularly suited for use in photography, it can of course also be employed for loading non-photographically active hydrophobic compounds on hydrophobic polymer particles. Such non-photographically active hydrophobic compounds can be i.a. enzymes, vitamins, hormones, herbicides, insecticides, as well as UV-absorbers or stabilizers for use in latex paints and lacquers.

The water-immiscible organic solvents useful in the practice of this invention are those:
that do not dissolve in or mix with distilled water at 20° C. for more than 10% by volume,
that have a boiling point above 35° C.,
that do not detrimentally react with the aqueous dispersion comprising the loadable polymer particles used in the method of the present invention, and
that are capable of dissolving or swelling said loadable polymer particles so that the latter can swell when in contact therewith.

Suitable water-immiscible organic solvents are e.g. ethyl acetate, isopropyl acetate, n-propyl acetate, n-butyl acetate, isobutyl acetate, sec.amyl acetate, n-amyl acetate, sec.amyl acetate, methylene chloride, chloroform, carbon tetrachloride, amyl chloride, cyclohexane, methylcyclohexane, isopropyl ether, diethyl carbonate, methyl isobutyl ketone, diisopropyl ketone, diisobutyl ketone, cyclohexanone, benzene, toluene, xylene, ligroin, nitromethane. Mixtures of these organic solvents can, of course, also be used. Preferred water-immiscible organic solvents are ethyl acetate, methylene chloride, and mixtures of these.

According to the method of the present invention a stable loaded latex composition that does not comprise substantial amounts of crystallized hydrophobic compound can be made provided the dispersed phase of the dispersion of hydrophobic compound, which is used as one of the starting materials in the method of the present invention, has an average droplet size lower than 5 μm.

The dispersion of hydrophobic polymer particles in water or aqueous medium suitable for use as the other starting material in the method of the present invention is any dispersion that satisfies the following requirements:
the dispersion essentially consists of water or aqueous medium as a continuous phase and loadable hydrophobic polymer particles as a dispersed or discontinuous phase, said polymer particles thus being substantially insoluble and non-swelling in water or in aqueous medium,
the hydrophobic polymer particles are loadable with a hydrophobic compound as above defined, meaning that the hydrophobic compound is adsorbed on or absorbed by the hydrophobic polymer particles,
the hydrophobic polymer particles are soluble or swellable in the water-immiscible organic solvent medium used for dissolving said at least one hydrophobic compound,
the hydrophobic polymer particles do not coagulate when the dispersion of said polymer particles in water or in an aqueous medium is mixed with said dispersion of said at least one hydrophobic compound, and
the hydrophobic polymer particles have an average diameter ranging from 0.02 to 5.0 μm, but within this range the particle size can be determined at wish depending on the particular use aimed at.

It is an advantage of the present invention that the average particle size of the dispersion of loadable polymer particles can be predetermined at wish depending on the intended use and before the dispersion is used for loading it with hydrophobic compound accordig to the method of the present invention.

Suitable polymers for forming the dispersion of loadable polymer particles in water or aqueous medium employed as starting material in the method of the present invention can be chosen from one or more of the known dispersions of polymer particles, provided they satisfy the above given requirements. The polymers can be homopolymers or copolymers derived from a major portion of one or more water-insoluble monomers. A great many of such monomers are known in the art. They include i.a. vinyl monomers, aliphatic and alicyclic dienes, acrylic esters and amides. Specific water-insoluble monomers that can be used to make loadable polymer particles for use in the method of the present invention can be found in e.g. Research Disclosure 19551 of July 1980 and in U.S. Pat. Nos. 4,614,708 and 4,861,818. Details about imparting water-insolubility to polymers particles or about increasing the water-insolubility of polymer particles such as by crosslinking the polymer molecules as well as examples of polymer particles can also be found in the above cited Research Disclosure 19551.

Preferred dispersions of loadable polymer particles in water or aqueous medium for use as starting material in the method of the present invention are i.a. aqueous dispersions of homopolymers or copolymers of acrylic acid, methacrylic acid, and salt or esters thereof, styrene, and mixtures of these, aqueous dispersions of polymethyl methacrylate, aqueous dispersions of polystyrene, aqueous dispersions of co(ethyl acrylate/stearyl methacrylate), aqueous dispersions of co(methacrylic acid/methyl methacrylate/stearyl methacrylate), and aqueous dispersions of polymer beads described in the above-mentioned U.S. Pat. Nos. 4,614,708 and 4,861,818.

As a non-restrictive example of a dispersion of loadable polymer particles in water or aqueous medium that is suited for use as starting material in the method of the present invention, the dispersion prepared as described hereinafter and called Dispersion PO1 is given.

PREPARATION 1

Dispersion PO1 having an average particle size of 0.9 μm

At room temperature 271.73 g of a 20% by weight solution of co(styrene/maleic acid monosodium salt) (pH=7) and 3752.2 g of demineralized water are mixed in a 10 l cylindrical double-walled reaction vessel. The solution is stirred by means of a rotor having a length of 15.5 cm and a width of 4 cm set at a speed of 100 rpm.

The reaction vessel is equipped with a reflux condenser and a nitrogen inlet reaching below the liquid level and is sealed. Hot water (65° C.) is fed through the double wall of the reaction vessel so that after 1 h the temperature of the solution reaches 65° C.

A continuous inlet of nitrogen keeps the solution free from oxygen.

An amount of 10.86 g of potassium persulphate is then added at once to the solution. Heating of the solution to 65° C. and stirring are continued for 2 h.

After this preliminary reaction step the stirring speed is maintained at 100 rpm. Next, 21.74 g of ARKOPAL N60, which is a dispersing agent commercially available from Hoechst, 2137.48 ml of methanol, and 1086.95 g of methyl methacrylate (not distilled preliminarily) are added in the given sequence under nitrogen atmosphere.

At this very moment the following parameters should be met:

1.0 g of potassium persulphate is present per 100 g of methyl methacrylate 2.0 g of ARKOPAL N60 is present per 100 g of methyl methacrylate the ratio by volume of methanol/water is 35/65 the concentration of monomer at the start of the reaction is 1.50 mol of methyl methacrylate per liter the stirring speed is 100 rpm.

The temperature of the water-bath is continuously kept at 65° C. The polymerization reaction is very slightly exothermic so that the temperature in the reaction vessel rises to a maximum of 65.5° C. At this moment a weak flow of cold tap water is pumped in addition to the hot water (65° C.) into the double wall, the flow of cold water being adjusted automatically with the aid of a contact thermometer, a relay, and an automatic water valve in such a way that as soon as the temperature in the reaction vessel drops to 65° C. the flow of cold water is interrupted immediately.

At the start of the polymerization reaction the solution has a clear aspect, but after some 30 min the solution becomes turbid and then slowly and gradually turns into a milky white dispersion.

Eventually, after a total polymerization period of 18 h the supply of hot water and of nitrogen is stopped. The bead dispersion obtained is cooled by means of cold tap water to about 30° C. with continuous stirring and then filtered through a nylon cloth having a mesh width of 60×60 μm. Filtering is easy, a maximum of 2.0 g of polymer in amorphous state remaining on the cloth.

Yield: 6795 g of Dispersion P01 (pH 5.6), which per 100 g comprises 16.5 g of dry residue.

Depending on the composition of the loaded polymer particles and the use aimed at, the dispersion of loaded particles can be coated as such or in admixture with other layer-forming components e.g. a hydrophilic colloid to form a layer making part of a layer assemblage e.g. an antihalation layer or filter layer of a photographic layer assemblage comprising a support and a light-sensitive layer. The hydrophilic colloid can be blended with the dispersion of loaded polymer particles so that the colloid is distributed within the resulting continuous phase of the latex. The resulting blend can be coated on a support and at least a portion of the water or aqueous medium is removed from the continuous phase to form a solid coating. In photographic applications the hydrophilic colloid is a protein, preferably gelatin.

Depending upon the specific photographic application, the coating containing the loaded polymer particles can be the sole coating on the support, or it can be an undercoat, an intermediate layer or an overcoat. The loaded polymer particles can also be incorporated into a light-sensitive gelatin silver halide emulsion layer or in another light-sensitive layer.

Important advantages that can be obtained according to the present invention are that hydrophobic compounds e.g. hydrophobic silver halide additives can be distributed uniformly, at a low cost, and in a stable manner through a hydrophilic colloid layer.

As mentioned before the dispersion of loaded particles can be coated as such without further addition of layer-forming components on a support or on another layer e.g. a layer making part of a photographic layer assemblage. Such layer can also be an undercoat, an intermediate layer or an overcoat. In case the layer essentially consisting of a dispersion of loaded particles is an overcoat layer, it may function as a permanent layer or alternatively as a temporary layer that is removable or strippable from said photographic layer assemblage.

High amounts of hydrophobic compounds can be loaded according to the method of the present invention onto the hydrophobic polymer particles that constitute the discontinuous phase of the dispersion. In general, the weight ratio of the hydrophobic compound to the hydrophobic polymer particles may range from 1:1000 to 1:3, preferably from about 1:10 to 1:2.

According to a special embodiment of the present invention the hydrophobic polymer particles constituting the discontinuous phase of the dispersion may be alkali-soluble hydrophobic polymer particles. The use of such alkali-soluble hydrophobic polymer particles in a temporary layer that is part of a photographic layer assemblage offers the possibility that during treatment of said photographic layer assemblage in an aqueous alkaline solution e.g. an alkaline developing solution, said temporary layer dissolves and can thus be removed entirely after having served a temporary purpose.

As a non-restrictive example of a dispersion of loadable alkali-soluble hydrophobic polymer particles in water or aqueous medium that is also suited for use as starting material in the method of the present invention, the dispersion prepared as described hereinafter and called Dispersion PO2 is given.

PREPARATION 2

Dispersion PO2 having an average particle size of 1.31 μm 435.96 g of an 18.7 aqueous solution of styrene maleic anhydride comprising 200 ppm of 5-bromo-5-nitro-1,3-dioxan and 3720.43 g of demineralized water are brought in a 10 l flask. An amount of 86.96 ml of a 25% aqueous solution of Mersolat H commercially available from Bayer is poured into the flask. The reaction mixture is heated to 75° C. and placed under nitrogen atmosphere.

Next, 16.30 g of potassium persulphate is added. The reaction mixture is stirred at 75° C. for 3 h. A solution of 21.74 of lauryl mercaptan, 21.74 g of stearyl methacrylate, 369.58 g of methacrylic acid, and 695.68 g of methyl methacrylate in 1774.32 ml of methanol is added to the reaction mixture with stirring at 150 rpm at 65° C.

Stirring is continued for 18 h at 65° C. The resulting dispersion is allowed to cool down and is filtered through a nylon cloth having a mesh width of 60×60 μm.

Yield: 6600 g of dispersion comprising 18.8 g of polymer beads per 100 g of dispersion. The average diameter of the beads is 1.31 μm.

The polymer beads obtained are soluble in an aqueous alkaline medium having a pH-value of at least 10.

The present invention is explained in greater detail by reference to the following examples. It should, however, not be construed as being limited thereto.

EXAMPLE 1

First, 1 g of the hydrophobic dye corresponding to the following structural formula:

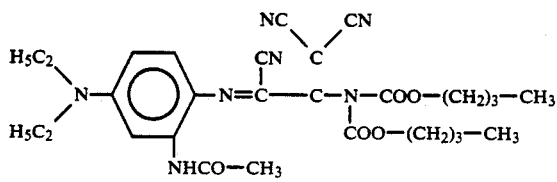

(absorption maximum at 650 nm) was dissolved in 18 ml of ethyl acetate. The solution obtained was dispersed in 5 min with stirring at 12000 rpm in 50 ml of demineralized water, to which 5 ml of a 10% aqueous solution of the sodium salt of n-dodecyl-benzene sulphonic acid had been added. The resulting dispersion of hydrophobic dye, called Dispersion HO1 hereinafter, was added to 45 g of Dispersion PO1 prepared as described above. The mixture obtained was stirred for 1 h. Finally, the ethyl acetate was removed by evaporation under reduced pressure.

Homodisperse polymer particles loaded with the hydrophobic dye were obtained. The dispersion did not comprise any conglomerates nor undissolved or crystallized dye particles. The stability of the dispersion of loaded polymer particles was very high.

For comparison, 1 g of the hydrophobic dye corresponding to the above structural formula was dissolved in 65 ml of acetone. The solution obtained was added as such to 45 g of Dispersion PO1 prepared as described above. The mixture obtained was stirred for 1 h. The acetone was removed by evaporation under reduced pressure.

In contrast with the dispersion obtained according to the invention, the present dispersion included many conglomerates and crystallized dye particles.

EXAMPLE 2

First, 4.7 g of the hydrophobic dye CI: Solvent Blue 53 (absorption maximum at 600 nm) was dissolved in 36 ml of ethyl acetate. The solution obtained was dispersed with stirring at 12000 rpm for 5 min in 90 ml of demineralized water, to which 10 ml of a 10% aqueous solution of ANTAROX CO-990, which is a dispersing agent commercially available from General Aniline, had been added. The resulting dispersion of the hydrophobic dye, called Dispersion HO2 hereinafter, was added to 100 g of Dispersion PO1 prepared as described above. The mixture obtained was stirred for 1 h. Finally, the ethyl acetate solvent was removed by evaporation under reduced pressure.

Homodisperse polymer particles loaded with the hydrophobic dye were obtained. The dispersion did not comprise any conglomerates nor undissolved or crystallized dye particles.

EXAMPLE 3

An amount of 3.6 g of the hydrophobic optical brightener BLANKOPHOR F.B.O. (trade mark), which is a 1-ethyl-3-phenyl-7-dimethylamino-2-quinolone compound sold by Bayer A. G., Leverkusen, Federal Republic of Germany, was dissolved in a solvent medium containing 54 ml of ethyl acetate and 16 ml of methylene chloride. The solution obtained was dispersed in 5 min with stirring at 10000 rpm in an aqueous medium containing 135 ml of demineralized water and 15 ml of a 10% aqueous solution of the sodium salt of n-dodecylbenzene sulphonic acid.

The resulting dispersion of optical brightener, called Dispersion HO3 hereinafter, was added to 191 g of Dispersion PO2 prepared as described above. The mixture obtained was stirred for 1 h. Finally, the solvent medium was removed by evaporation under reduced pressure.

The weight of the dispersion obtained was adjusted to 360 g by addition of demineralized water. The resulting dispersion contained 11% by weight of homodisperse loaded polymer particles. The weight ratio of polymer particles to hydrophobic optical brightener loaded thereon was 10:1.

The dispersion obtained did not comprise any conglomerates nor undissolved or crystallized particles of optical brightener.

The dispersion obtained was coated on a paper support A at a ratio of 200 mg of optical brightener per m2 (Paper A).

For comparison a Paper B was made as follows.

An amount of 20 g of the above-mentioned BLANKOPHOR F.B.O. (trade mark), 25 ml of a 20% aqueous solution of the surfactant TAMOL-NNOK-SA, commercially available from BASF, and 50 ml of demineralized water was ground for 2 h with 400 g of Ottawa sand in a Spangenberg sand mill. The sand was removed by filtration. Next, 100 g of a 20% aqueous gelatin solution was added to the filtered dispersion. The total weight of the dispersion was adjusted to 400 g by addition of demineralized water. The dispersion obtained was coated on a same paper support and at a same ratio of 200 mg of optical brightener per m2 (Paper B).

The whiteness of the dried Paper A was found to be excellent and far higher than that obtained with the dried Paper B carrying the hydrophobic optical brightener in a same weight per m2 as in paper A but without polymer particles.

EXAMPLE 4

An amount of 6 g of the hydrophobic optical brightener BLANKOPHOR F.B.O. (trade mark), which is a 1-ethyl-3-phenyl-7-dimethylamino-2-quinolone compound sold by Bayer A. G., Leverkusen, Federal Republic of Germany, was dissolved in a solvent medium containing 54 ml of ethyl acetate and 16 ml of methylene chloride. The solution obtained was dispersed in 5 min with stirring at 10000 rpm in an aqueous medium containing 135 ml of demineralized water and 15 ml of a 10% aqueous solution of the sodium salt of n-dodecylbenzene sulphonic acid.

The resulting dispersion of optical brightener, called Dispersion HO4 hereinafter, was added to 150 g of a 40% aqueous polyurethane latex commercially available from Bayer under the trade mark IMPRANIL CA43086. The mixture obtained was stirred for 1 h. Finally, the solvent medium was removed by evaporation under reduced pressure.

The weight of the dispersion obtained was adjusted to 300 g by addition of demineralized water. The resulting dispersion contained 22 g of loaded latex per 100 g. The weight ratio of polyurethane latex particles to hydrophobic optical brightener loaded thereon was 10:1.

Polymer particles loaded with the optical brightener were obtained. The dispersion did not comprise any conglomerates nor undissolved or crystallized dye particles.

We claim:

1. Method of making aqueous dispersions of polymer particles loaded with at least one hydrophobic compound for subsequent use, comprising the consecutive steps of:

dissolving said at least one non-polymeric hydrophobic compound in a water-immiscible organic solvent medium, dispersing the solution obtained of said at least one non-polymeric hydrophobic compound in water or in an aqueous medium to form a dispersed phase having an average droplet size lower than 5 μm, mixing the resulting dispersion of said at least one hydrophobic compound with a dispersion of polymer particles in water or in an aqueous medium, said polymer particles being swellable in said water-immiscible solvent medium and having an average particle diameter ranging from 0.02 to 5.0 μm, stirring the mixture obtained to allow said non-polymeric hydrophobic compound to associate with said polymer particles, and removing said water-immiscible organic solvent medium by evaporation to provide an aqueous dispersion for said subsequent use.

2. A method according to claim 1, wherein said hydrophobic compound is a dye, an optical brightener, an UV-absorbing agent, a spectral sensitizer, a polymerizable compound, or a photoinitiator.

3. A method according to claim 1, wherein said dispersion of polymer particles in water or in an aqueous medium is a dispersion of homopolymers or copolymers of acrylic acid, methacrylic acid, and salt or esters thereof, styrene, and mixtures of these, a dispersion of polymethyl methacrylate, a dispersion of polystyrene, a dispersion of co(ethyl acrylate/stearyl methacrylate), or a dispersion of co(methacrylic acid/methyl methacrylate/stearyl methacrylate).

4. A method according to claim 1, wherein said polymer particles have an average particle diameter ranging from 0.2 to 4.6 μm.

5. A method according to claim 1, wherein the weight ratio of said hydrophobic compound to said polymer particles ranges from about 1:10 to 1:2.

6. A method according to claim 1, wherein said polymer particles of the dispersion are alkali-soluble polymer particles.

7. A method according to claim 1, wherein said water-immiscible organic solvent is ethyl acetate, methylene chloride, or a mixture thereof.

* * * * *